United States Patent [19]

Niemetz

[11] Patent Number: 5,053,923
[45] Date of Patent: Oct. 1, 1991

[54] ELECTRONIC CONTROL UNIT WITH COMMON GROUND CONNECTION TO A HEAT SINK

[75] Inventor: Linhard Niemetz, Rednitzhembach, Fed. Rep. of Germany

[73] Assignee: Telefunken electronic GmbH, Heilbronn, Fed. Rep. of Germany

[21] Appl. No.: 433,987

[22] Filed: Nov. 9, 1989

[30] Foreign Application Priority Data

Nov. 9, 1988 [DE] Fed. Rep. of Germany ....... 3837974

[51] Int. Cl.$^5$ ............................................. H05K 7/20
[52] U.S. Cl. .................................... 361/388; 174/51; 361/421
[58] Field of Search ............ 174/51, 35 R, 35 C, 174/252, 260; 357/81; 165/80.3, 185; 307/10.1; 363/141; 361/380, 382, 386–388, 395, 421, 399, 413, 424; 439/620

[56] References Cited

U.S. PATENT DOCUMENTS

| 3,649,461 | 3/1987 | Matsuta | 361/415 |
| 4,047,242 | 9/1977 | Jakob | 361/389 |
| 4,050,093 | 9/1977 | Crall | 361/383 |
| 4,471,314 | 9/1984 | Lindberg | 330/10 |
| 4,605,986 | 8/1986 | Bentz | 361/386 |
| 4,775,917 | 10/1988 | Eichhorn et al. | 361/388 |
| 4,872,091 | 10/1989 | Maniwa et al. | 174/51 |
| 4,893,215 | 1/1990 | Urushiwara | 361/387 |
| 4,899,256 | 2/1990 | Sway-Tin | 361/386 |

FOREIGN PATENT DOCUMENTS

| 0093029 | 11/1983 | European Pat. Off. . |
| 0098028 | 1/1984 | European Pat. Off. . |
| 2536957 | 2/1977 | Fed. Rep. of Germany . |
| 2804292 | 8/1978 | Fed. Rep. of Germany . |
| 8317699 | 11/1984 | Fed. Rep. of Germany . |
| 3604074 | 8/1987 | Fed. Rep. of Germany . |
| 8623251 | 2/1988 | Fed. Rep. of Germany . |
| 8715073 | 4/1988 | Fed. Rep. of Germany . |
| 3643288 | 6/1988 | Fed. Rep. of Germany . |

Primary Examiner—Gerald P. Tolin
Attorney, Agent, or Firm—Spencer & Frank

[57] ABSTRACT

The invention relates to an electronic control unit, in particular an ignition control unit, containing an electronic circuit in the form of a hybrid circuit arranged on a heat sink, and having a plastic housing element containing the plug terminal jack. There is an electrical connection between the ground connection of the hybrid circuit and a plug terminal. In accordance with the invention, the ground connection between the hybrid circuit and the plug terminal is connected to the heat sink by electrically conducting parts contained in the plastic housing element.

6 Claims, 1 Drawing Sheet

ELECTRONIC CONTROL UNIT WITH COMMON GROUND CONNECTION TO A HEAT SINK

BACKGROUND OF THE INVENTION

The invention relates to an electronic control unit in particular an ignition control unit, comprising an electronic circuit in the form of a hybrid circuit arranged on a heat sink, and a plastic housing element containing the plug terminal jack, with a connection existing between the ground terminal of the hybrid circuit and a plug terminal of the jack.

Many electronic control units, for example ignition circuits in thick-film technology, consist of an electronic circuit, a heat sink and a housing with plastic frame. The electronic circuit usually contains one or more hybrid circuits mounted on the upper side of a ceramic substrate which electrically insulates it from the heat sink.

The plastic housing, in which a metal lead frame is integrated, is riveted to the heat sink, the rivet having to be inserted separately when assembling the housing of the ignition control unit. The part of the lead frame inside the plastic housing is connected by bonded wires to the electronic circuit and the outside part of the lead frame is part of the connector. One pin of the lead frame is used to connect the ground of the hybrid circuit to the ground pin of the connector.

In addition to the hybrid circuit/connector ground connection, most electronic control units have a wire bonded connection from the hybrid circuit to the metallic heat sink. Therefore the electronic ground of the hybrid circuit is connected with a very low ohmic resistance to the heat sink.

The electrical connection between the ground of the electronic circuit and the heat sink increases the so-called electro-magnetic compatibility of the control unit, i.e. it improves the behaviour of the control unit under the influence of electro-magnetic fields.

This additional ground connection must—in the event of a fault, i.e. when the ground pin of the connector breaks or becomes high—resistance—drain off the working current of the control unit, for example 7.5A in the case of ignition control units, via the ground bond-/heat sink/mounting plate route, and so be sufficiently strong for this current. In addition, the hybrid layout must be designed so that the altered current path does not lead to ground coupling in the electronic circuit and an impairment of the functioning of the control unit. Furthermore, the additional ground connection must start from the single point ground of the circuit, so that no malfunctions of the control unit occurs if the ground pin of the connector is faulty.

These demands on the ground/bond connection can very often only be met with great difficulty, and result in higher space requirements both on the hybrid circuit and on the heat sink, as well as additional intersections on the hybrid circuit.

When assembling the electronic control unit, an additional bonding process from the hybrid circuit to the heat sink is necessary. To achieve a good contact of the bond to the heat sink, the heat sink has to be machined to get access to the bare metal.

SUMMARY OF THE INVENTION

The object underlying the invention is to reduce the assembly expense and the manufacturing costs of electronic control units, particularly ignition control units, and tc indicate a control unit which dispenses with an additional ground/bond connection between the hybrid circuit and the heat sink.

This is achieved in accordance with the invention by the ground connection between the hybrid circuit and the plug terminal being connected to the heat sink by electrically conducting parts, and in particular a metal board or lead frame incorporated in the plastic housing frame.

Advantageous embodiments of the invention are given in the subclaims.

Making the ground connection using the lead frame integrated in the housing element necessitates an additional electrical connection between the hybrid circuit and the heat sink.

A simple layout with only one current path without additional ground pad is therefore possible, so that the space requirement on the hybrid circuit and the heat sink is reduced.

A reduction of the assembly expense is also achieved—in addition to the omission of the additional bonding process—by the fact that insertion of rivets is dispensed with during assembly or injection-molding of the housing, since the rivets are already integrated into the metal board or lead frame.

BRIEF DESCRIPTION OF THE DRAWINGS

The invention is described in the following on the basis of an example of an ignition control unit, where.

DESCRIPTION OF THE PREFERRED EMBODIMENTS

Figure 1:
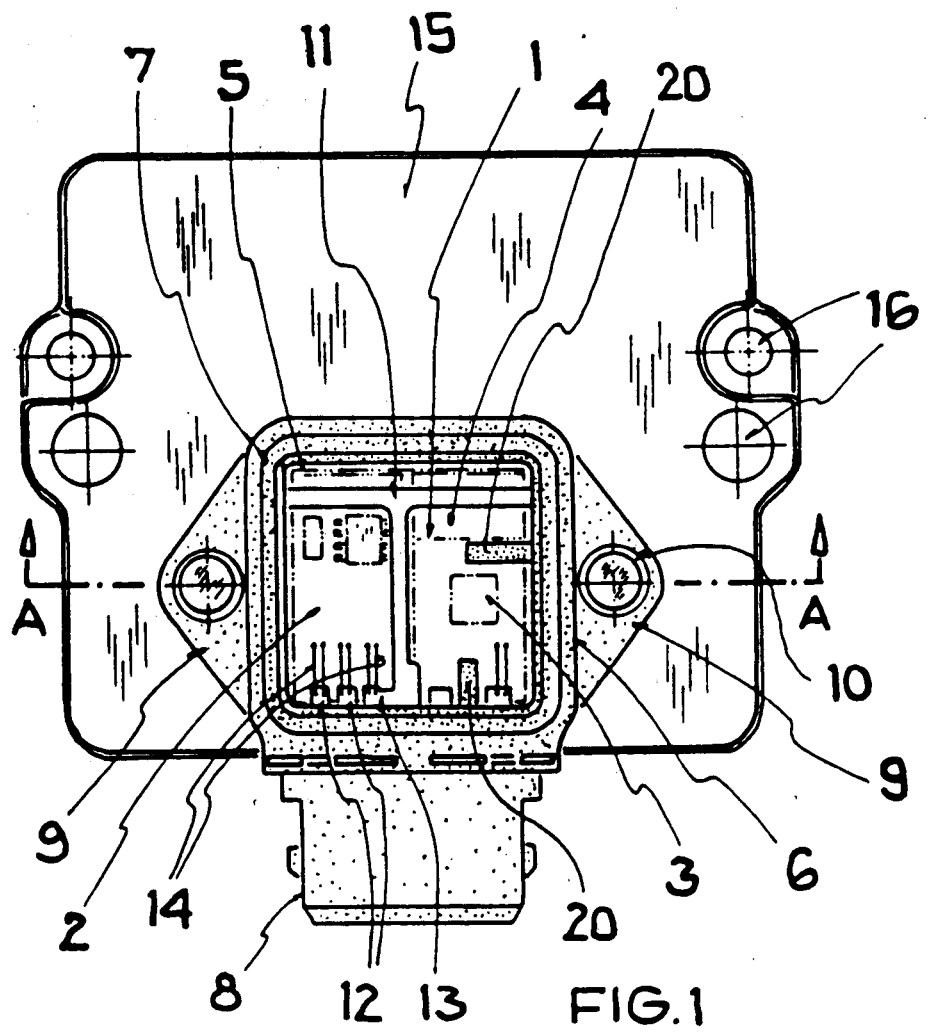
FIG. 1 shows a plan view of the structure of an ignition control unit.
Figure 2:
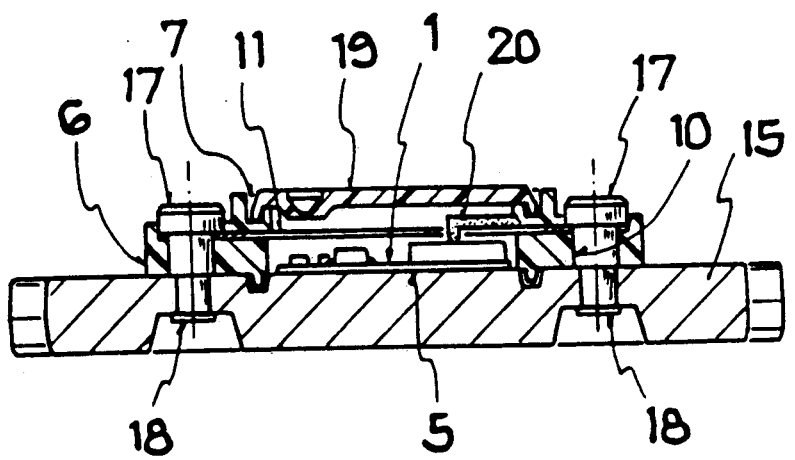
FIG. 2 shows the ignition control unit in a section along the line A—A in FIG. 1.

According to FIGS. 1 and 2, the ignition control unit contains a heat sink 15, a housing element 6 with plastic frame 7, a plug terminal jack or sleeve 8 and cover 19, plus an electronic ignition circuit 1.

The electronic circuit 1 is usually located on a ceramic carrier element 5 used for electrical insulation of the electronic circuit 1 from the heat sink 15. The main components of the electronic ignition circuit 1 are the control section 2, the power pack 3, and an RC combination 4.

A metal board or lead frame 11 whose plug terminals 12, 13 are connected to the electronic circuit 1 via bonded wires 14 and extend into the jack 8, is integrated in the plastic housing element 6. The metal board 11 is therefore used for contacting the electronic circuit 1 and provides an external connection option for the ignition control unit via the plug terminal jack 8.

The holes 10 in the laterally extending flange-shaped part 9 of the plastic frame 7 are used for fastening the frame 7 to the heat sink 15. The holes 16 in the heat sink are used for mounting the ignition control unit on a plate in the engine compartment of the vehicle.

The electronic circuit 1 is pressed in a defined manner against the heat sink 15 during assembly using the pressure elements 20 integrated in the housing frame 7.

The manufacturing method of the ground connection integrated in the housing element to the heat sink and its mode of operation is now described on the basis of an embodiment.

The metal board 11 is, for example, a stamping of $CuSn_6$ suitably surface-treated. The board 11 has two holes aligned with holes 10 into which two aluminum rivets 17 are pressed, for example, that have an electrical connection to the metal board 11.

After enclosing the metal board 11 in an injection-molded housing element 6, the two rivets 17 protrude from the underside of the flange-shaped part 9 of the plastic frame 7. When mounting the plastic frame 7 on the heat sink 15, the rivets 17 are passed through two holes in the heat sink and riveted to the underside of the heat sink 15. By the riveted joint 18 to the heat sink, the plastic frame 7 and hence the entire housing element 6 is attached to the heat sink 15 on the one hand, and an electrical connection between the rivet 17 and the heat sink 15 made on the other hand.

Once the control section 2 of the electronic circuit has been electrically connected to plug terminals 12, 13 of the metal board, for example using bonded wires 14, the heat sink 15 also is electrically connected to the ground of the hybrid circuit via the path rivet/metal board/bonding wire, by the ground plug terminal 13 in accordance with FIG. 1.

In addition to their use in ignition control units, the integrated ground connection can also be used for example in electronic injection systems or similar electronic control units in which various assembly groups of the electronic circuit to be provided on a heat sink are designed in hybrid technology.

What is claimed is:

1. An electronic control unit, in particular an ignition control unit, comprising an electronic circuit in the form of a hybrid circuit arranged on a heat sink, and a plastic housing element containing the hybrid circuit and having a plug terminal jack with a plurality of plug terminals therein, with an electrical connection existing between a ground terminal of said hybrid circuit and a ground plug terminal of said jack, wherein said connection between the ground terminal of said hybrid circuit and said ground plug terminal is simultaneously connected to said heat sink by electrically conducting parts, including a metal board, contained in said plastic housing element.

2. An electronic control unit according to claim 1, wherein the plastic housing element comprises a framelike section and the plug terminal jack, wherein said framelike section has a plurality of laterally extending flange-shaped parts containing through-type openings for mounting fasteners for connecting said housing element on the heat sink, and wherein said metal board extends into said plug terminal jack to form said ground plug terminal, is arranged in said plastic frame, and connects the ground plug terminal to said through-type openings.

3. An electronic control unit according to claim 2, wherein the through-type openings contain screws or rivets as said fasteners through which the plastic housing element is mechanically firmly connected to the heat sink, and at the same time said screws or rivets make the electrical connection between the metal board and said heat sink.

4. An electronic control unit according to claim 3, wherein the screws or rivets comprise a metal with good electrical conductivity, for example aluminum.

5. A method for manufacture of an electronic control unit according to claim 3, wherein: the metal board including the plug terminal and with through-type openings containing the fasteners is enclosed, together with the other plug terminals, in plastic by injection molding to form the framelike section and the plug terminal jack of the housing element, such that said fasteners protrude from the underside of said plastic housing element, and the plastic housing element is mounted on the heat sink by inserting the fasteners into openings in the heat sink and firmly connecting the fasteners to the heat sink.

6. An electronic control unit, in particular an ignition control unit, comprising: an electronic circuit in the form of a hybrid circuit arranged on a heat sink; a plastic housing including a plug terminal jack, containing a plurality of plug terminals, disposed on said heat sink and surrounding said circuit; conductive fastening means extending through at least one opening in said housing for connecting said housing to said heat sink; means connecting a ground terminal of said hybrid circuit to one of said plug terminals; and a metal board, integral with said one of said plug terminals and disposed in said housing, extending to said at least one opening in said housing and electrically contacted by said fastening means to electrically connect said heat sink to said ground terminal of said hybrid circuit.

* * * * *